(12) United States Patent
Ohtsu et al.

(10) Patent No.: US 10,710,932 B2
(45) Date of Patent: Jul. 14, 2020

(54) DIELECTRIC COMPOSITION AND ELECTRONIC COMPONENT

(71) Applicant: TDK CORPORATION, Tokyo (JP)

(72) Inventors: Daisuke Ohtsu, Xiamen (CN); Taku Masai, Xiamen (CN); Liu Hailong, Xiamen (CN); Liang Liping, Xiamen (CN)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/357,860

(22) Filed: Mar. 19, 2019

(65) Prior Publication Data

US 2019/0300436 A1 Oct. 3, 2019

(30) Foreign Application Priority Data

Mar. 30, 2018 (CN) .............................. 201810296559

(51) Int. Cl.
*C04B 35/468* (2006.01)
*C04B 35/47* (2006.01)
(Continued)

(52) U.S. Cl.
CPC .......... *C04B 35/4682* (2013.01); *C04B 35/47* (2013.01); *C04B 35/475* (2013.01);
(Continued)

(58) Field of Classification Search
CPC .......................... C04B 35/4682; H01G 4/1227
See application file for complete search history.

(56) References Cited

U.S. PATENT DOCUMENTS 6,248,254 B1 * 6/2001 Kimura ................. C04B 35/465
252/62.9 R
6,372,152 B1 * 4/2002 Sawada ................. C04B 35/475
252/62.9 R
(Continued)

FOREIGN PATENT DOCUMENTS

JP 2003-163132 A 6/2003

*Primary Examiner* — Karl E Group
(74) *Attorney, Agent, or Firm* — Oliff PLC

(57) ABSTRACT

The object of the present invention is to provide the dielectric composition having good specific permittivity, high DC breakdown voltage and AC breakdown voltage, small dielectric loss and heat generating property, and good temperature property even though lead is not substantially used. A dielectric composition of the first aspect includes a, Ca, Bi, Ti, and Sr, wherein the dielectric composition includes two phases having different Sr characteristic X ray intensities when a characteristic X ray intensity derived from Sr is measured by EPMA, and when Sr1 represents the characteristic X ray intensity derived from Sr of a first phase measured by EPMA and Sr2 represents the characteristic X ray intensity derived from Sr of a second phase measured by EPMA, a ratio (Sr2/Sr1) of Sr2 with respect to Sr1 satisfies 2 or larger. A dielectric composition of the second aspect includes Ba, Ca, Bi, Ti, and Sr, wherein the dielectric composition includes three phases having different Sr characteristic X ray intensities when a characteristic X ray intensity derived from Sr is measured by EPMA, and when Sr1 represents the characteristic X ray intensity derived from Sr of a first phase measured by EPMA, Sr2 represents the characteristic X ray intensity derived from Sr of a second phase measured by EPMA, and Sr3 represents the characteristic X ray intensity derived from Sr of a third phase measured by EPMA, an intensity ratio (Sr1/Sr3) of Sr1 with respect to Sr3 is 0.6 or less and an intensity ratio (Sr2/Sr3) of Sr2 with respect to Sr3 is 1.4 or more.

16 Claims, 3 Drawing Sheets

(51) Int. Cl.
    *C04B 35/453*    (2006.01)
    *H01G 4/12*      (2006.01)
    *C04B 35/475*    (2006.01)

(52) U.S. Cl.
    CPC .............. *C04B 2235/3236* (2013.01); *C04B 2235/5436* (2013.01); *C04B 2235/5445* (2013.01); *H01G 4/1227* (2013.01)

(56) References Cited

U.S. PATENT DOCUMENTS

| | | | | |
|---|---|---|---|---|
| 6,461,532 | B1* | 10/2002 | Oka | C04B 35/475 |
| | | | | 252/62.9 R |
| 9,202,626 | B2* | 12/2015 | Suzuki | H01G 4/1227 |
| 2019/0300435 | A1* | 10/2019 | Liping | H01G 4/30 |
| 2019/0300436 | A1* | 10/2019 | Ohtsu | C04B 35/4682 |
| 2019/0300437 | A1* | 10/2019 | Hailong | C04B 35/4682 |

* cited by examiner

DIELECTRIC COMPOSITION AND ELECTRONIC COMPONENT

BACKGROUND OF THE INVENTION

The present invention relates to a dielectric composition and an electronic component.

In recent years, electronic devices have rapidly attained higher-performances, and along with that electronic circuits have rapidly become more compact and more complicated. Thus, electronic components are also demanded to become even more compact and to attain even higher performance. That is, the dielectric composition and the electronic component having high specific permittivity with low loss, and generating only small amount of heat, attaining high AC breakdown voltage and DC break down voltage in order to be used under high voltage, and also attaining a good temperature property are demanded.

In order to correspond to the above demands, Patent Document 1 discloses $PbTiO_3$—$SrTiO_3$—$Bi_2Ti_3O_9$ based dielectric composition. However, the dielectric composition includes lead hence it was a problem from environmental point of view.

Also, as the dielectric ceramic composition having high permittivity which is widely used for a ceramic capacitor, a multilayer capacitor, a high frequency capacitor, a high voltage capacitor, and the like, those having $BaTiO_3$—$BaZrO_3$—$CaTiO_3$—$SrTiO_3$ based dielectric ceramic composition as a main component is known.

A conventional $BaTiO_3$—$BaZrO_3$—$CaTiO_3$—$SrTiO_3$ based dielectric ceramic composition has strong permittivity, thus it was difficult to attain high DC breakdown voltage and AC breakdown voltage while maintaining high capacitance and low dielectric loss.

[Patent Document 1] JP Patent Application Laid Open No. 2003-163132

BRIEF SUMMARY OF THE INVENTION

The object of the present invention is to provide a dielectric composition having high specific permittivity, and DC breakdown voltage and AC breakdown voltage, a low dielectric loss, and a good temperature property even though lead is substantially not used, and also to provide an electronic component including the dielectric composition.

In order to attain the above object, the present invention provides following dielectric composition and electronic component.

(1) A dielectric composition including Ba, Ca, Bi, Ti, and Sr, wherein the dielectric composition includes two phases having different Sr characteristic X ray intensities when a characteristic X ray intensity derived from Sr is measured by EPMA, and when Sr1 represents the characteristic X ray intensity derived from Sr of a first phase measured by EPMA and Sr2 represents the characteristic X ray intensity derived from Sr of a second phase measured by EPMA, a ratio (Sr2/Sr1) of Sr2 with respect to Sr1 satisfies 2 or larger.

(2) The dielectric composition according to (1), wherein the first phase comprises a dielectric particle having a crystal particle size of 0.1 μm or more and 10 μm or less, and the second phase comprises a dielectric particle having a crystal particle size of 0.1 μm or more and 10 μm or less.

(3) The dielectric composition according to (1), wherein when X represents an area ratio of the first phase with respect to an entire observation field of EPMA and Y represents an area ratio of the second phase with respect to an entire observation field of EPMA, an area ratio (X/Y) of X with respect to Y is 0.1 or more.

(4) The dielectric composition according to (3), wherein a ratio of a total area (X+Y) of the first phase and the second phase with respect to the entire observation field of EPMA is 95% or more.

(5) A dielectric composition including Ba, Ca, Bi, Ti, and Sr, wherein the dielectric composition includes three phases having different Sr characteristic X ray intensities when a characteristic X ray intensity derived from Sr is measured by EPMA, and when Sr1 represents the characteristic X ray intensity derived from Sr of a first phase measured by EPMA, Sr2 represents the characteristic X ray intensity derived from Sr of a second phase measured by EPMA, and Sr3 represents the characteristic X ray intensity derived from Sr of a third phase measured by EPMA, an intensity ratio (Sr1/Sr3) of Sr1 with respect to Sr3 is 0.6 or less and an intensity ratio (Sr2/Sr3) of Sr2 with respect to Sr3 is 1.4 or more.

(6) The dielectric composition according to (5), wherein the first phase comprises a dielectric particle having a crystal particle size of 0.1 μm or more and 10 μm or less, the second phase comprises a dielectric particle having a crystal particle size of 0.1 μm or more and 10 μm or less, and the third phase comprises a dielectric particle having a crystal particle size of 0.1 μm or more and 10 μm or less.

(7) The dielectric composition according to (5), wherein when X represents an area ratio of the first phase with respect to an entire observation field of EPMA, Y represents an area ratio of the second phase with respect to an entire observation field of EPMA, and Z represents an area ratio of the third phase with respect to an entire observation field of EPMA, an area ratio (X/Y) of X with respect to Y is 0.1 or more and an area ratio (Z/Y) of Z with respect to Y is 0.17 or more.

(8) The dielectric composition according to (7), wherein a ratio of a total area (X+Y+Z) of the first phase, the second phase, and the third phase with respect to the entire observation field of EPMA is 95% or more.

(9) An electronic component including the dielectric composition according to any one of above (1) to (8).

The dielectric composition of the present invention can attain high specific permittivity, DC breakdown voltage, and AC breakdown voltage, a low dielectric loss, a small heat generating property, and good temperature property and heat generating property, even though lead is not substantially used.

DETAILED DESCRIPTION OF THE INVENTION

Hereinafter, a specific embodiment of the present invention is described based on figures.

Figure 1:
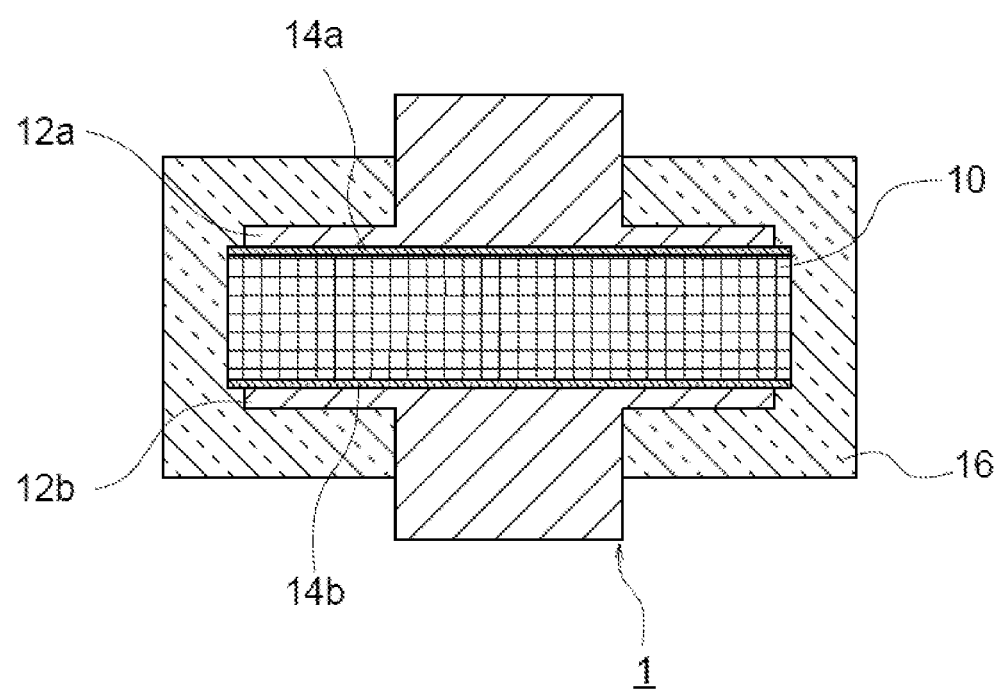
FIG. 1 is a cross section image of a single layer capacitor according to an embodiment of the present invention.

A type of an electronic component including a dielectric composition of the present embodiment is not particularly limited, and for example a single layer capacitor 1 shown in FIG. 1 may be mentioned.

The single layer capacitor 1 shown in FIG. 1 has a dielectric composition 10 according to the present embodiment. On both faces of the dielectric composition 10, terminals 12a and 12b are respectively adhered via electrodes 14a and 14b, and a synthetic resin 16 covers the entire surface thereof.

The dielectric composition according to the present embodiment includes Ba, Ca, Bi, Ti, and Sr, and when an intensity of characteristic X ray derived from Sr (hereinafter, it may be referred as "Sr characteristic X ray intensity") is measured, the dielectric composition includes two or three phases having different Sr characteristic X ray intensities. That is, the dielectric composition of the present invention forms a phase-separation structure made of two or three phases having clearly different Sr compositions. Hereinafter, the two phase structure is described in the first embodiment, and the three phase structure is described in the second embodiment, and the overlapping embodiments may be omitted from describing.

First Embodiment

The dielectric composition according to the first embodiment of the present invention includes Ba, Ca, Bi, Ti, and Sr. When characteristic X ray intensity derived from Sr is measured by EPMA, the dielectric composition includes two phases having different Sr characteristic X ray intensities. This indicates that two phases having different Sr concentrations are included in the dielectric composition.

EPMA observation is done by mirror polishing a cross section of the dielectric composition after sintering (sintered body) which has been cut, then an image of the mirror polished face is taken by Scanning Electron Microscope (SEM). Further, EPMA (Electron Probe Micro Analyzer) is used to observe the same observation field as the SEM image, then mapping analysis of Sr (strontium) is carried out. Mapping by EPMA is carried out by measuring the intensity of the characteristic X ray derived from Sr.

SEM image is taken and also EPMA mapping analysis is carried out to the observation field of (12.5 to 50)μm×(10 to 40)μm under a magnification of 2500× to 10000×.

Figure 2:
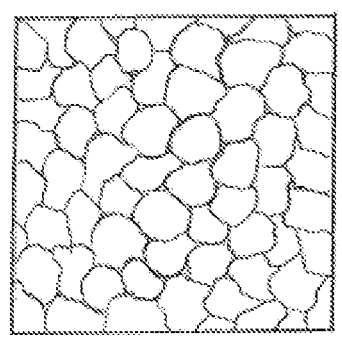
FIG. 2 is a schematic diagram of SEM image of a cross section of a dielectric layer according to an embodiment of the present invention.
Figure 3:
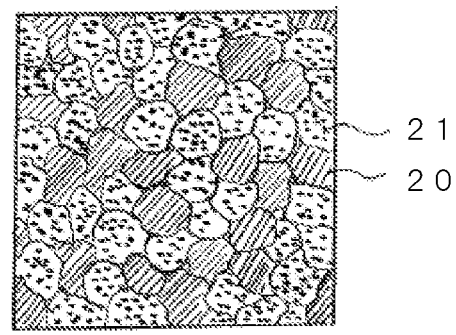
FIG. 3 is a schematic image of Sr mapping of a cross section of a dielectric layer according to the first embodiment.

First, outline of each particle is determined by SEM image. Then, the outline of said each particle is overlapped on Sr mapping. A schematic figure of SEM image of the dielectric composition according to the first embodiment is shown in FIG. 2. The outline of each particle is determined as shown in FIG. 2. Also, a mapping analysis of Sr by EPMA observation in the same observation field is carried out. A schematic figure of mapping is shown in FIG. 3. In FIG. 3, a particle 20 indicated by oblique lines is a phase having relatively low Sr characteristic X ray intensity (hereinafter, it may be referred as "low Sr phase"), and a particle 21 indicated by dots is a phase having relatively high Sr characteristic X ray intensity (hereinafter, it may be referred as "high Sr phase").

Two phase structure of the dielectric particle having different Sr characteristic X ray intensities can be confirmed by a compositional analysis of EPMA. Here, each phase may be a continuous phase, or may be a discontinuous phase. Also, two phases have clearly different Sr characteristic X ray intensities, and this means that Sr composition of each phase is clearly different.

Here, when the first phase is a phase having relatively low Sr characteristic X ray intensity (low Sr phase) and the second phase is a phase having relatively high Sr characteristic X ray intensity (high Sr phase), and also when Sr1 represents the characteristic X ray intensity derived from Sr of the first phase and Sr2 represents the characteristic X ray intensity derived from Sr of the second phase, an intensity ratio (Sr2/Sr1) of Sr2 with respect to Sr1 is 2 or larger, preferably 5 or larger, and further preferably within the range of 10 to 100.

Although a mechanism is not clear, by taking two phase structure having different Sr compositions and not forming a homogenous phase, high specific permittivity, DC breakdown voltage and AC breakdown voltage, a low dielectric loss at usual temperature, and good heat generating property and temperature property can be attained, even though lead is substantially not used.

The two phases form a phase-separation structure in which Sr compositions are clearly different. Here, clearly different Sr compositions mean that when an intensity of characteristic X ray derived from Sr at each point by EPMA measurement and a frequency of the intensity are plotted, it can be separated into two peaks, and a peak of low Sr phase and a peak of high Sr phase do not overlap.

In case Sr characteristic X ray intensities vary within the first phase (low Sr phase), an average of Sr characteristic X ray intensities of the first phase group is used as Sr1. In case Sr characteristic X ray intensities vary within the second phase (high Sr phase), an average of Sr characteristic X ray intensities of the second phase group is used as Sr2.

The first phase may be a continuous phase, and also it may be a discontinuous phase. Similarly, the second phase may be a continuous phase, and also it maybe a discontinuous phase. However, in the first embodiment, each phase is preferably made of a crystal particle.

In case each phase is made of the crystal particle, the first phase is made of the dielectric particle having a particle size of 0.05 to 15 μm, and more preferably 0.1 to 10 μm, and the second phase is made of the dielectric particle having a particle size of 0.05 to 15 μm, and more preferably 0.1 to 10 μm. By regulating the crystal particle size, the specific permittivity, the DC breakdown voltage, and the AC breakdown voltage can be further enhanced.

The crystal particle size is obtained from circle equivalent diameter. "Circle equivalent diameter" means a diameter of circle having the same area as a projected area of the particle, and it is also called Haywood diameter. The circle equivalent diameter can be obtained from an image of STEM-EDS.

The dielectric composition of the first embodiment preferably has the above mentioned first phase and second phase in predetermined ratio. Specifically, when X represents the area ratio of the first phase with respect to the entire observation field of EPMA and Y represents the area ratio of the second phase with respect to the entire observation field of EPMA, the area ratio (X/Y) of X with respect to Y is preferably 0.1 or larger, more preferably 0.2 or larger, and particularly preferably 0.25 to 4. When X/Y ratio is 0.1 or larger, the heat generating property and the temperature characteristic can be further enhanced.

Here, the area ratio refers to ratio of each area of first phase (low Sr phase) and second phase (high Sr phase) with respect to entire observation field of a cross section of the sintered body, and it is obtained from the image of STEM-EDS.

The dielectric composition of the first embodiment is substantially made of the first phase (low Sr phase) and the second phase (high Sr phase), and an intermediate phase (in which Sr concentration is between the first phase and the second phase) is not included. Therefore, in the dielectric composition of the first embodiment, a ratio of the total area (X+Y) of the first phase and the second phase with respect to the entire observation field of EPMA is preferably 95% or more, more preferably 97% or more, and particularly preferably 99% or more. By regulating X+Y, the AC breakdown voltage, the dielectric loss, and the temperature property can be further enhanced.

The area ratio X of the first phase in the dielectric composition of the first embodiment is preferably 5 to 95% more, preferably 10 to 90%, and particularly preferably 15 to 60% with respect to the entire observation field of EPMA. Also, the area ratio Y of the second phase is preferably 5 to 95%, more preferably, 10 to 90%, and particularly preferably 40 to 85%. By regulating X and Y, the AC breakdown voltage, the dielectric loss, and the temperature property can be further enhanced.

The dielectric composition of the first embodiment includes Ba, Ca, Bi, and Ti in addition to Sr. When a total of cations (Sr, Ba, Ca, Bi, Ti, and the like) of the dielectric composition is 100 cation %, a preferable content of each element in the first embodiment is as follow.

Sr: 0.03 to 12.5 cation %
Ba: 22 to 49.8 cation %
Ca: 0.05 to 5.9 cation %
Bi: 0.2 to 23.6 cation %
Ti: 47 to 50 cation %

The dielectric composition according to the first embodiment includes a composite phase made of the above mentioned first phase (low Sr phase) and the second phase (high Sr phase) as the main component. By including such composite phase as the main component, even though leas is not substantially used, it is possible to obtain the dielectric composition having a high permittivity of 1250 or higher, while having a good temperature property of 20% to −59% at −25° C. to 125° C., a high AC breakdown voltage of 4.9 kV/mm or higher, a high DC breakdown voltage of 11.2 kV/mm or higher, small dielectric loss of 0.42% or less at 1 kHz and 9.8% or less at 1 MHz, and also having a good temperature property of 15° C. or lower of heat generation when 90 kHz 250V/mm is applied.

On the other hand, if the structure of the main component does not satisfy the above mentioned requirement, at least one of the specific permittivity, the dielectric loss, the temperature property, the heat generating property, the DC break down voltage, and the AC breakdown voltage may deteriorate.

Note that, in the dielectric composition according to the first embodiment, not substantially using lead means that a content of lead is 0.001 wt % or less with respect to 100 wt % of the entire dielectric composition. In the dielectric composition according to the first embodiment, environmental burden can be reduced by not substantially using lead.

The dielectric composition according to the first embodiment can include various subcomponents in addition to the above mentioned main component. For example, as a subcomponent, a compound including manganese, a compound including iron, a compound including chromium, a compound including tin, a compound including dysprosium, a compound including niobium, and the like may be used. These may be used alone, or two or more of these may be combined. By using appropriate amount of these, the dielectric loss can be made small, and the specific permittivity, the DC breakdown voltage, and the AC breakdown voltage can be increased.

In case of using the subcomponent, a total content of these is 0 to 3 wt % more preferably it is 0.2 to 1.5 wt %, and more preferably 0.25 to 1.0 wt % in terms of $MnCO_3$, $Fe_2O_3$, $Cr_2O_3$, $SnO_2$, $Dy_2O_3$, and $Nb_2O_5$.

Second Embodiment

The dielectric composition according to the second embodiment of the present invention includes Ba, Ca, Bi, Ti, and Sr. The dielectric composition includes three phases having different Sr characteristic X ray intensities when the characteristic X ray intensity derived from Sr is measured by EPMA.

Figure 4:
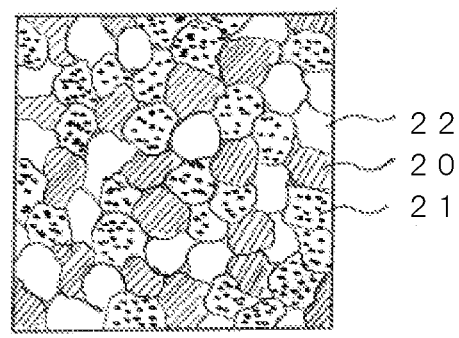
FIG. 4 is a schematic image of Sr mapping of a cross section of a dielectric layer according to the second embodiment.

EPMA observation, SEM observation, element mapping, and the like are done as similar to the above. FIG. 4 shows a schematic diagram of Sr mapping of the dielectric composition according to the second embodiment. In FIG. 4, a particle 20 indicated by oblique lines is a phase having relatively low Sr characteristic X ray intensity (low Sr phase), and a particle 21 indicated by dots is a phase having relatively high Sr characteristic X ray intensity (high Sr phase). Also, the particle with no special marks has Sr characteristic X ray intensity which is between the low Sr phase and the high Sr phase, and hereinafter it may be referred as "intermediate Sr phase".

The three phase structure having different Sr characteristic intensities of the dielectric composition according to the second embodiment can be confirmed by a compositional analysis of EPMA. Here, each phase may be a continuous phase, or it may be a discontinuous phase. Also, the three phases have clearly different Sr characteristic X ray intensities, and this means that each phase has different Sr compositions.

Here, when a phase having relatively low Sr characteristic X ray intensity (low Sr phase) is the first phase, a phase having relatively high Sr characteristic X ray intensity (high Sr phase) is the second phase, and a phase having Sr characteristic X ray intensity between the first phase and the second phase (intermediate Sr phase) is the third phase, and also when Sr1 represents the characteristic X ray intensity derived from Sr of the first phase, Sr2 represents the characteristic X ray intensity derived from Sr of the second phase, and Sr3 represents the characteristic X ray intensity derived from Sr of the third phase, then an intensity ratio (Sr1/Sr3) of Sr1 with respect to Sr3 is 0.6 or less, and preferably within the range of 0.25 to 0.6, and an intensity ratio (Sr2/Sr3) of Sr2 with respect to Sr3 is 1.4 or more, and preferably within the range of 1.4 to 5.

Although a mechanism is not clear, by taking three phase structure having different Sr compositions and not forming a homogenous phase, high specific permittivity, DC breakdown voltage and AC breakdown voltage, a low dielectric loss at usual temperature, and good heat generating property and temperature property can be attained, even though lead is substantially not used.

The three phases form a phase-separation structure in which Sr compositions are clearly different. Here, clearly different Sr compositions mean that when a characteristic X ray intensity derived from Sr at each point by EPMA measurement and a frequency of the intensity are plotted, it is separated into three peaks, and a peak of low Sr phase, a peak of intermediate Sr phase, and a peak of high Sr phase do not overlap.

In case Sr characteristic X ray intensities vary within the first phase (low Sr phase), an average of Sr characteristic X ray intensities of the first phase group is used as Sr1. In case Sr characteristic X ray intensities vary within the second phase (high Sr phase), an average of Sr characteristic X ray intensity belonging in the second phase group is used as Sr2. In case Sr characteristic X ray intensities vary within the third phase (intermediate Sr phase), an average of Sr characteristic X ray intensities of the third phase group is used as Sr2.

The first phase may be a continuous phase, and also it may be a discontinuous phase. Similarly, the second phase may be a continuous phase, and also it maybe a discontinuous phase. Similarly, the third phase may be a continuous phase, and also it maybe a discontinuous phase. However, in the second embodiment, each phase is preferably made of a crystal particle.

In case each phase is made of the crystal particles, the first phase is made of the dielectric particle having a particle size of 0.05 to 15 μm, and more preferably 0.1 to 10 μm, the second phase is made of the dielectric particle having a particle size of 0.05 to 15 μm, and more preferably 0.1 to 10 μm, and the third phase is made of the dielectric particle having a particle size of 0.05 to 15 μm, and more preferably 0.1 to 10 μm. By regulating the crystal particle size, even better DC breakdown voltage and AC breakdown voltage, dielectric loss, and temperature property can be attained. The crystal particle size can be obtained by a circle equivalent diameter as similar to the above.

The dielectric composition of the second embodiment preferably has the above mentioned first phase, second phase, and third phase in predetermined ratio. Specifically, when X represents the area ratio of the first phase with respect to the entire observation field of EPMA, Y represents the area ratio of the second phase with respect to the entire observation field of EPMA, and Z represents the area ratio of the third phase with respect to the entire observation field of EPMA, the area ratio (X/Y) of X with respect to Y is preferably 0.1 or larger, more preferably 0.3 or larger, and particularly preferably 0.5 to 2. When X/Y ratio is 0.1 or larger, the heat generating property and the temperature characteristic can be further enhanced.

Also, the area ratio (Z/Y) of Z with respect to Y is preferably 0.17 or larger, more preferably 0.2 or larger, and particularly preferably 0.2 to 18. By regulating Z/Y ratio, the DC breakdown voltage and the dielectric loss can be further enhanced.

Here, the area ratio can be obtained from the image of STEM-EDS as similar to the above.

The dielectric composition of the second embodiment is substantially made of the first phase (low Sr phase), the second phase (high Sr phase), and the third phase (intermediate Sr phase) in which the Sr concentration is between the first phase and the second phase. Therefore, in the dielectric composition of the second embodiment, a ratio of the total area (X+Y+Z) of the first phase, second phase, third phase with respect to the entire observation field of EPMA is preferably 95% or more, more preferably 97% or more, and particularly preferably 99% or more. By regulating X+Y+Z, the specific permittivity, the DC breakdown voltage, and the dielectric loss can be made even smaller, and even better heat generating property and temperature property can be attained.

The area ratio X of the first phase in the dielectric composition of the second embodiment is preferably 2 to 46%, more preferably 5 to 45%, and particularly preferably 10 to 40% with respect to the entire observation field of EPMA. Also, the area ratio Y of the second phase is preferably 2 to 46%, more preferably 5 to 45%, and particularly preferably 10 to 40%. Also, the area ratio Z of the third phase is preferably 8 to 96%, more preferably 10 to 90%, and particularly preferably 20 to 80%. By regulating X, Y, and Z, the specific permittivity, the DC breakdown voltage, and the dielectric loss can be made even smaller, and even better heat generating property and temperature property can be attained.

The dielectric composition of the second embodiment includes Ba, Ca, Bi, and Ti in addition to Sr. When a total of cations (Sr, Ba, Ca, Bi, Ti, and the like) of the dielectric composition is 100 cation %, a preferable content of each element in the second embodiment is as follow.

Sr: 1.5 to 30 cation %
Ba: 11.7 to 37.4 cation %
Ca: 0.05 to 5.9 cation %
Bi: 0.2 to 23.6 cation %
Ti: 47 to 50 cation %

The dielectric composition according to the second embodiment includes a composite phase made of the above mentioned first phase (low Sr phase), second phase (high Sr phase), and the third phase (intermediate Sr phase) as the main component. By including such composite phase as the main component, even though lead is not substantially used, it is possible to obtain the dielectric composition having a high specific permittivity of 1250 or higher, while having a good temperature property of 16% to −52% at −25° C. to 125° C., a high AC breakdown voltage of 3.6 kV/mm or higher, a high DC breakdown voltage of 11.2 kV/mm or higher, small dielectric loss of 0.34% or less at 1 kHz and 9.1% or less at 1 MHz, and also having a good temperature property (ΔT) of 15° C. or less of heat generation when 90 kHz 250V/mm is applied.

On the other hand, if the structure of the main component does not satisfy the above mentioned requirement, at least one of the specific permittivity, the dielectric loss, the temperature property, the heat generating property, the DC breakdown voltage, and the AC breakdown voltage may deteriorate.

Note that, in the dielectric composition according to the second embodiment, not substantially using lead means that a content of lead is 0.001 wt % or less with respect to 100 wt % of the entire dielectric composition. In the dielectric composition according to the second embodiment, environmental burden can be reduced by not substantially using lead.

The dielectric composition according to the second embodiment can include subcomponents and the added amount is same as mentioned in above.

Method of Producing Dielectric Composition

Hereinafter, a method of producing the dielectric composition according to the first and second embodiments is described, however the method of producing the dielectric composition and electronic component is not limited thereto.

First, a raw material powder of the dielectric composition according to the present embodiment is prepared. As the raw material powder, a powder of a compound of each component or a powder of a compound which becomes each component by firing is prepared. Among these components, as for barium titanate ($BaTiO_3$) and strontium titanate ($SrTiO_3$), barium titanate powder and strontium titanate powder are preferably prepared when preparing the raw material.

Also, bismuth calcium titanate ($CaBi_4Ti_4O_{15}$) may be prepared in advance, or raw materials which generate bismuth calcium titanate during firing of dielectrics may be used. As the raw materials which generate bismuth calcium titanate, for example bismuth oxide, titanium oxide, and calcium carbonate may be mentioned, but the raw materials are not limited thereto. Bismuth calcium titanate prepared in advance is used because it can improve the DC breakdown voltage and AC breakdown voltage, and the temperature property, and also the dielectric loss can be lowered.

As for the subcomponents, other than oxides of each element, a compound which becomes oxides of each element after firing such as carbonates, nitrates, sulfates, and the like can be prepared.

Next, the raw material powder of each component is mixed, and the mixed powder is obtained. The method of mixing is not particularly limited, and usual method such as a dry mixing method, a wet mixing method, and the like can be used.

The method of producing the dielectric composition having the two phase structure according to the first embodiment is not particularly limited, and also the method of producing the dielectric composition having the three phase structure according to the second embodiment is also not particularly limited. However, by controlling the main component composition, a phase-separation condition can be controlled, thus the dielectric composition having the two phase structure or three phase structure can be obtained. A non-limiting specific example regarding the method of controlling a phase structure is described.

When "a" mol % represents the content of barium titanate in terms of $BaTiO_3$, "b" mol % represents the content of strontium titanate in terms of $SrTiO_3$, and "c" mol % represents the content of bismuth calcium titanate in terms of $CaBi_4Ti_4O_{15}$, and when a+b+c=100 is satisfied, said "a", "b", and "c" are preferably within the following range.

When the range defined by said "a", "b", and "c" is shown on the ternary phase diagram, it is a range surrounded by following four points of point A, point B, point C, and point D.

point A: (a, b, c)=(40, 40, 20)
point B: (a, b, c)=(80, 0.1, 19.9)
point C: (a, b, c)=(98, 1, 1)
point D: (a, b, c)=(40, 59.5, 0.5)

When the main component composition is controlled to be within the above range, the main phase easily separate in two phases, and the dielectric composition according to the first embodiment is easily obtained. Note that, when the main component composition is within following range, the three phase structure is easily formed.

That is, when preparing the dielectric composition having three phase structure according to the second embodiment, "a", "b", and "c" of the main component composition is preferably within the following range.

When the range defined by said preferable "a", "b", and "c" is shown on the ternary phase diagram, the range is surrounded by following four points of point A', point B', point C', and point D'.

point A': (a, b, c)=(40, 40, 20)
point B': (a, b, c)=(75.5, 4.5, 20)
point C': (a, b, c)=(75.5, 24.4, 0.1)
point D': (a, b, c)=(40, 59.9, 0.1)

Figure 5:
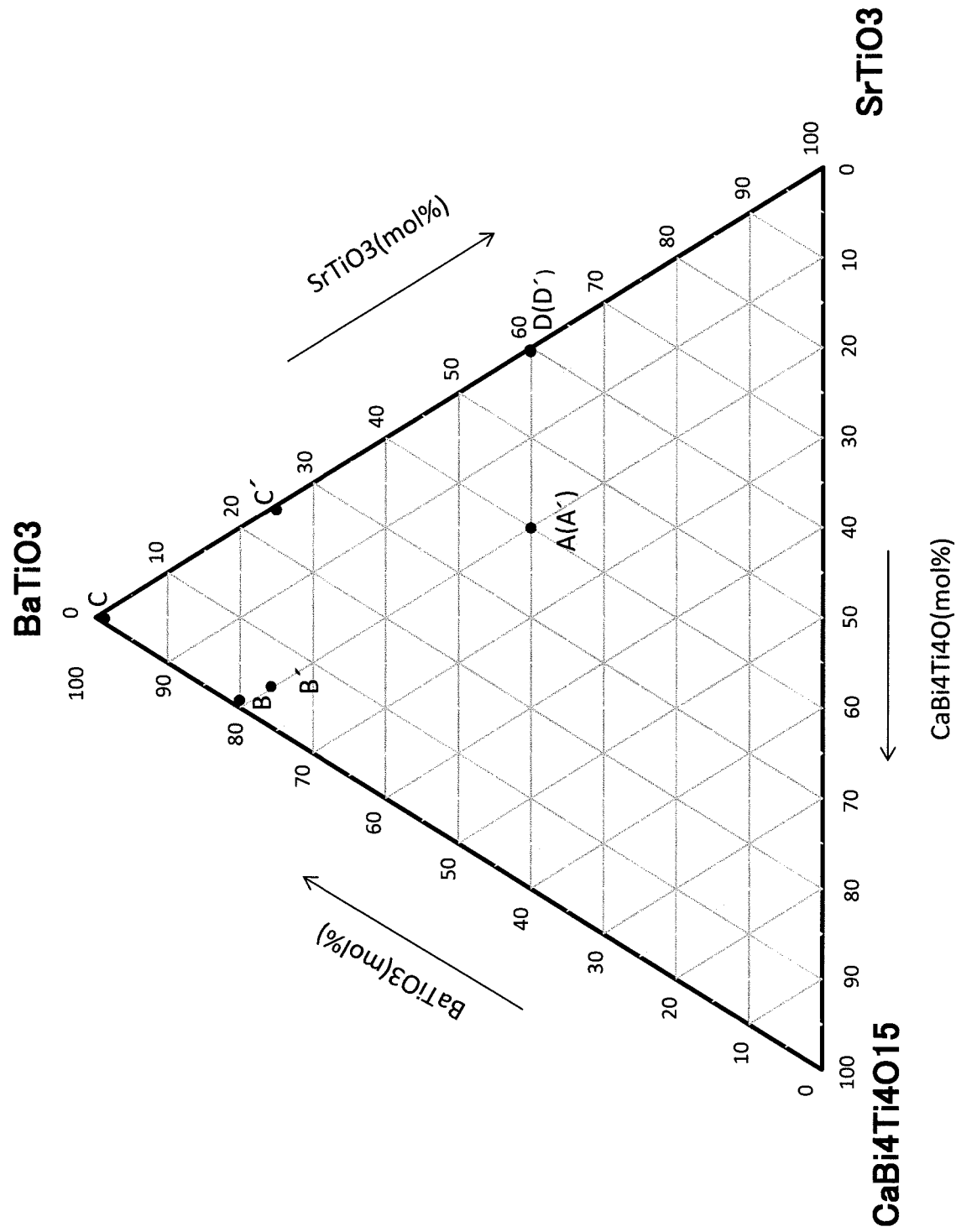
FIG. 5 is a ternary phase diagram, of a composition of a main component according to the present embodiment.

The ternary phase diagram showing the position of each point is shown in FIG. 5.

That is, when obtaining the dielectric composition having the three phase structure according to the second embodiment, each composition of the main component is preferably within the range surrounded by the four points of point A', point B', point C', and point D' (which is inside the square formed by A'B'C'D'). On the other hand, when obtaining the dielectric composition having the two phase structure according to the first embodiment, each composition of the main component is preferably within the range surrounded by the four points of point A, point B, point C, and point D (which is inside the square formed by ABCD).

On the other hand, when the content of barium titanate is less than 50 mol %, at least one of the specific permittivity, the heat generating property, and the temperature property may deteriorate. When the content of barium titanate is more than 83 mol %, at least one of the dielectric loss and the heat generating property may deteriorate.

Also, when the content of bismuth calcium titanate is less than 0.5 mol %, at least one of the temperature property, the dielectric loss, and the heat generating property may decrease, and if it exceeds 5 mol %, the specific permittivity may decrease.

After determining the main component composition and mixing the subcomponents depending on needs as described in above, the mixed powder is granulated, and after granulation it is sieved if necessary, thereby granules are obtained. A method of granulation is not particularly limited. For example, a method of granulating by adding the mixed powder into PVA (polyvinyl alcohol) aqueous solution may be mentioned. Also, a method of sieving is not particularly limited. For example, a coarse granulated powder may be removed by sieving.

Next, the granules are molded, and a molded body made of the dielectric composition is obtained. A method of molding is not particularly limited, and a usual method can be used. For example, a pressure molding can be used. Pressure applied during a pressure molding is not particularly limited. For example, it can be 200 to 600 MPa.

Next, by firing the obtained molded body, a sintered body made of the dielectric composition is obtained. A firing condition is not particularly limited. A firing temperature can be 1100 to 1350° C. A firing atmosphere is not particularly limited. For example, the atmosphere may be in air, in nitrogen atmosphere, in a reduced atmosphere using nitrogen and hydrogen, and it may be other atmosphere as well.

Note that, when sintering is carried out for a long period of time at high temperature, each component diffuses, and a homogenous phase is easily formed. Thus, in order to form a phase-separation structure of the present embodiments, it is preferable to sinter for 0.5 to 3 hours in case of sintering at high temperature of 1300° C. or higher. Also, when sintering at 1100 to 1300° C. or so, the sintering time is preferably 1 to 4.5 hours.

When each phase is a crystal particle, the particle size can be controlled by a sintering condition and the particle size of a raw material particle. For example, when a raw material having a large particle size is used as strontium titanate and strontium carbonate which contain Sr, the particle size of the second phase (high Sr phase) becomes larger, and when a particle having a large particle size is used as a raw material which does not contain strontium, the particle size of the first phase (low Sr phase) becomes larger. Also, by making the sintering temperature relatively high and making the sintering time relatively longer, a particle growth occurs, and the particle size becomes larger. Also, ion diffusion between the raw material particles facilitates to form the third phase (intermediate Sr phase) having Sr concentration between the low Sr phase and the high Sr phase; hence the particle size of the third phase also becomes larger.

Also, instead of barium titanate powder, strontium titanate powder, and bismuth calcium titanate powder; in case barium carbonate, strontium carbonate, bismuth oxide powder, titanium oxide powder, and calcium carbonate powder are used as the raw material particles which are the raw material powder of the above mentioned barium titanate powder, strontium titanate powder, and bismuth calcium titanate powder, a phase having uniform composition is easily formed, as a result this facilitates forming of the third phase (intermediate Sr phase).

Also, the area ratio of each phase can be controlled by blending the raw material particles. For example, when strontium titanate and strontium carbonate which contain Sr are used a lot, the area ratio Y of the second phase (high Sr phase) increases. Also, in case the ratio of the raw material particle which does not contain Sr increases, the area ratio X of the first phase (low Sr phase) increases. The particle size can be enlarged. Also, by making the sintering temperature relatively high and making the sintering time relatively longer, ion diffusion between the raw material particles facilitates forming of the third phase (intermediate Sr phase) having Sr concentration between the low Sr phase and the high Sr phase; hence the area ratio of the third phase increases.

Also, instead of barium titanate powder, strontium titanate powder, and bismuth calcium titanate powder; in case barium carbonate, strontium carbonate, bismuth oxide powder, titanium oxide powder, and calcium carbonate powder are used as the raw material particles which are the raw material powder of the above mentioned barium titanate powder, strontium titanate powder, and bismuth calcium titanate powder, a phase having uniform composition is easily formed, as a result this facilitates forming of the third phase (intermediate Sr phase), and as a result the area ratio of the third phase (intermediate Sr phase) increases.

Next, a pair of electrodes is bonded to the obtained sintered body. The pair of electrodes may be bonded for example to two opposing faces of the obtained sintered body.

Also, a method of bonding the electrodes to the sintered body is not particularly limited. For example, an electrode paste may be coated to the obtained sintered body, and then baked at 700 to 900° C.; thereby the electrodes can be bonded to the obtained sintered body. As the electrode paste, for example Ag paste, Cu paste, and the like can be used.

Further, a terminal is connected via the electrodes. A method of connecting the terminal via the electrodes is not particularly limited. Further, a resin is coated to the entire surface of the dielectric composition but exposing part of the terminal. A coating method and a type of the resin for coating are not particularly limited.

The single layer capacitor as shown in FIG. 1 can be obtained as such. The single layer capacitor can be used under extremely high voltage by using the dielectric composition according to the present embodiment.

Note that, in the above, the single layer capacitor shown in FIG. 1 was used as the electronic component according to the present embodiment in order to explain the method of production, however the electronic component of the present invention is not limited to a single layer capacitor, and it may be other capacitors such as a multilayer capacitor and the like. A method of producing the multilayer capacitor and the like is not particularly limited, and a known method of production can be used. Also, purpose of use of the electronic component of the present invention is not particularly limited, and the present invention can be suitably used as a high frequency capacitor and a high voltage capacitor.

EXAMPLES

Hereinafter, the present invention will be described in further detail based on examples, but the present invention is not to be limited thereto.

Examples and Comparative Examples

As raw material powders, barium titanate powder, strontium titanate powder, bismuth calcium titanate powder, bismuth oxide powder, titanium oxide powder, calcium carbonate powder, and subcomponent powders were prepared. Then, these were weighed so that the composition of Examples and Comparative examples shown in Table 1 were able to obtain at the end. Note that, in Table 1, BT represents barium titanate ($BaTiO_3$), ST represents strontium titanate ($SrTiO_3$), and CBT represents bismuth calcium titanate ($CaBi_4Ti_4O_{15}$).

After mixing all of the raw material powders, the material powders were finely pulverized using a pot mill so that the average particle size was 0.5 to 3 µm or so. The average particle size of the raw material powders each experiment example is shown in Table 1. The particle size of the finely pulverized raw material powder was measured using laser diffraction particle size analyzer, and D50 of cumulative particle size distribution was defined as the average particle size. After dehydrating and drying the fine pulverized powder, polyvinyl alcohol was added as an organic binder, and granulation and sieving were carried out, thereby granules were obtained.

The granules were molded by applying a pressure of 300 MPa, thereby a molded body of a circular disk shape having a diameter of 16.5 mm, a thickness of 0.65 mm was obtained.

The molded body was fired in air for 4 hours at 1100 to 1350° C.; thereby a ceramic element of a circular disk shape was obtained. The sintering temperature of each experiment example is shown in Table 1. The composition of the obtained ceramic element was subjected to a photo luminescence X ray analysis to verify it satisfied the composition shown in Table 1 in terms of certain oxides and carbonates. Next, Ag electrode paste was coated to both faces of the ceramic element, and baked in air atmosphere; thereby the capacitor sample was obtained. A number of capacitor samples necessary for carrying out all of the evaluations shown in below were produced.

The phase-separation structure of the obtained dielectric composition and the particle size of each phase were verified by following method. (SEM, EPMA)

For each sample, a sintered body was cut and a cross section was mirror polished, and Scanning Electron Microscope (SEM) image of a mirror polished face was taken. Further, EPMA (Electron Probe Micro Analyzer) observation was carried out in a same observation field as said SEM image, and Sr mapping analysis of each experiment sample was carried out.

For cross section of one sintered body per one sample, ten fields of visions having an area of 25 µm×20 µm at 5000× magnification were set, and SEM imaging and EPMA mapping were carried out so that the particle size, the area, and the like of 300 to 1000 particles were able to measure.

Outline of each particle was defined by SEM image. A schematic diagram of the outline of each particle is shown in FIG. 2.

Further, FIG. 3 and FIG. 4 show schematic diagrams which the schematic diagram of Sr mapping is overlapped on the outline of said each particle. Note that, in FIG. 3 and FIG. 4, the part with oblique lines is a part having low Sr characteristic X ray intensity (low Sr part) in Sr mapping, and the part with dots is a part having high Sr characteristic X ray intensity (high Sr phase). Also, the part with no marks is a part of which Sr characteristic X ray intensity is between the low Sr phase and the high Sr phase.

(EPMA Intensity Ratio)

The average of Sr characteristic X ray intensity of the phase having relatively low Sr characteristic X ray intensity (low Sr phase) was defined as Sr1, the average of Sr characteristic X ray intensity of the phase having relatively high Sr characteristic X ray intensity (high Sr phase) was defined as Sr2, and the average of Sr characteristic X ray intensity of the phase of which Sr characteristic X ray intensity was between the low Sr phase and the high Sr phase (intermediate Sr phase) was defined as Sr3.

From this analysis result, when the dielectric composition had two phase structure, Sr2/Sr1 was calculated, and when the dielectric composition had three phase structure, Sr1/Sr3 and Sr2/Sr3 were calculated.

(Particle Size of Each Phase and Average Particle Size)

For each sample, the circle equivalent diameter was calculated from the area of each particle having different Sr characteristic X ray intensity, and the average was calculated.

For sample numbers 27 to 32, it was confirmed that there was no difference in Sr characteristic X ray intensity between each particle and Sr composition was uniform, and the dielectrics were formed by crystal particles having the average particle size of 3μm.

(Area Ratio of Each Phase)

The area ratio of each phase was calculated from SEM image and EPMA element mapping when measuring the average particle size. The area ratio of the low Sr phase was defined X, the area ratio of the high Sr phase was defined Y, and the area ratio of the intermediate Sr phase was defined Z.

From these analysis results, when the dielectric composition had the two phase structure, X/Y was calculated, and when the dielectric composition had the three phase structure, X/Y and Z/Y were calculated.

Also, for the obtained capacitor sample, the specific permittivity, the dielectric loss, the insulation resistance, the DC breakdown voltage and AC breakdown voltage, and the capacitance temperature property were evaluated. Hereinafter, an evaluation method is described.

(Specific Permittivity ($\varepsilon s$))

A capacitance of a circular disk shape capacitor sample was measured using an LCR meter under the condition of a temperature of 25° C., a frequency of 1 kHz, an input signal level (measuring voltage) of 1.0 Vrms, thereby a specific permittivity ($\varepsilon s$) was calculated from the capacitance. In the present example, $\varepsilon s \geq 1250$ was considered good, and $\varepsilon s \geq 1400$ was considered even better.

(Dielectric Loss)

The dielectric loss (tan δ) at a standard temperature of 25° C. of a capacitor sample was measured under the condition of a frequency of 1 kHz, an input signal level (measuring voltage) of 1.0 Vrms using LCR meter. It was also measured under 1 MHz and a measuring voltage of 1.0 Vrms. In the present example, when the dielectric loss (tan δ) at a frequency of 1 kHz was 0.5% or less, it was considered good. When the dielectric loss (tan δ) at 1 MHz was 10% or less, it was considered good.

(Insulation Resistance (IR))

Using an insulation resistance meter (R8340A by Advantest) to a capacitor sample, DC voltage of 500 V was applied at 20° C. for 10 seconds and left for 50 seconds, then the insulation resistance IR after the voltage application was measured. In the present example, $5.0 \times 10^5 \Omega$ or more was considered good.

(Heat Generating Property)

A sample was made of which the diameter of the ceramic element was changed so that the sample after Ag-electrode being baked showed 1000 pF, then a lead wire was installed and an insulation resin was coated. A temperature where the temperature of the ceramic element after coating the insulation resin applied with AC90 kHz·250 V (250V/mm per 1 mm) was stabilized was measured. The temperature difference (ΔT) between the element temperature and the atmosphere temperature was obtained. The smaller the ΔT is, the lower the heat generating property is. In the present examples, ΔT of 15° C. or less was considered good.

(AC Breakdown Voltage)

A measurement of AC breakdown voltage (AC-Eb, kV/mm) was carried out by following method. Both ends of a capacitor sample obtained were applied with AC electric field. The AC electric field was increased at a speed of 200 V/s, and a change in leak current was observed by an AC voltage withstand tester. An electric field when the leak current was 50 mA was divided by the thickness of the capacitor sample, thereby the AC breakdown voltage (AC-Eb) per unit thickness was obtained. The higher the AC-Eb is, the higher the AC breakdown voltage is, and hence it can be considered that a voltage resistance against the AC voltage is excellent. In the present example, AC-Eb≥3.5 kV/mm was considered good, and AC-Eb≥5.1 kV/mm was considered even better.

(DC Breakdown Voltage)

A measurement of DC breakdown voltage (DC-Eb, kV/mm) was carried out by following method. Both ends of a capacitor sample obtained were applied with DC electric field. The DC electric field was increased at a speed of 100 V/s, and a change in a leak current was observed. An electric field when the leak current was 100 mA was divided by the thickness of the capacitor sample, thereby the DC breakdown voltage (DC-Eb) per unit thickness was obtained. The higher the DC-Eb is, the higher the DC breakdown voltage is, hence it can be considered that a voltage resistance against the DC voltage is excellent. In the present example, DC-Eb≥10 kV/mm was considered good, and DC-Eb≥14 kV/mm was considered even better.

(Temperature Property)

A method of measuring the temperature property TC (%) is as described in below. First, temperature was changed within the range of −25° C. to +125° C., and the capacitance at each temperature was measured. The capacitance was measured using a LCR meter under the condition of a frequency of 1 kHz, an input signal level of 1.0 Vrms. Then, when the capacitance at the standard temperature of +25° C. was $C_{25}$ and the capacitance at T(° C.) was $C_T$, TC at each temperature was measured according to below equation.

$$TC(\%) = \{(C_T - C_{25})/C_{25}\} \times 10^2$$

In the present example, when TC constantly satisfied −60≤TC≤+22 within the range of −25° C. to +125° C., it was considered good. In the present example, when TC was within the above mentioned range at −25° C. and +125° C., then TC was within the above mentioned range at other temperatures in the range of −25° C. to +125° C. Thus, in Table 2, TC at −25° C., 85° C., and +125° C. are shown. Note that, even if TC did not constantly satisfied −60≤TC≤+22 within the range of −25° C. to +125° C., the above mentioned object of the present invention can be attained. The measurement results mentioned in above is shown in Table.

TABLE 1

| Sample No. | Main Component parts by mol | | | | | | | Subcomponents Amount with respect to 100 wt % of main component | | | | | | Raw material particle size (μm) | Sintering temp (° C.) |
|---|---|---|---|---|---|---|---|---|---|---|---|---|---|---|---|
| | BT | ST | CBT | BaCO3 | SrCO3 | Bi2O3 | TD2 | CaCO3 | MnCO3 | Cr2O3 | Fe2O3 | SnO2 | Dy2O3 | Nb2O5 | | |
| 1 | 80.0 | 17.0 | 3.0 | — | — | — | — | — | 0.3 | — | — | — | — | 0.5 | 0.5 | 1100 |
| 2 | 80.0 | 17.5 | 3.0 | — | — | — | — | — | 0.3 | — | — | — | — | 0.5 | 0.5 | 1120 |
| 3 | 80.0 | 17.5 | 3.0 | — | — | — | — | — | 0.3 | — | — | — | — | 0.5 | 1.5 | 1250 |
| 4 | 80.0 | 17.5 | 3.0 | — | — | — | — | — | 0.3 | — | — | — | — | 0.5 | 0.5 | 1300 |
| 5 | 80.0 | 17.0 | 3.0 | — | — | — | — | — | 0.3 | — | — | — | — | 0.5 | 0.5 | 1350 |
| 6 | 75.0 | 23.0 | 2.0 | — | — | — | — | — | 0.3 | — | — | — | — | 0.5 | 0.5 | 1100 |
| 7 | 75.0 | 23.0 | 2.0 | — | — | — | — | — | 0.3 | — | — | — | — | 0.5 | 0.5 | 1120 |
| 8 | 75.0 | 23.0 | 2.0 | — | — | — | — | — | 0.3 | — | — | — | — | 0.5 | 1.5 | 1240 |
| 9 | 75.0 | 23.0 | 2.0 | — | — | — | — | — | 0.3 | — | — | — | — | 0.5 | 0.5 | 1300 |
| 10 | 75.0 | 23.0 | 2.0 | — | — | — | — | — | 0.3 | — | — | — | — | 0.5 | 0.5 | 1350 |
| 11 | 15.0 | 10.25 | 0.75 | 60.0 | 12.8 | 4.5 | 81.8 | 2.3 | 0.3 | — | — | — | — | 0.5 | 1.5 | 1250 |
| 12 | 18.8 | 5.75 | 0.50 | 56.3 | 17.3 | 3.0 | 79.5 | 1.5 | 0.3 | — | — | — | — | 0.5 | 1.5 | 1250 |
| 13 | 25.5 | 7.82 | 0.68 | 49.5 | 15.2 | 2.6 | 70.0 | 1.3 | 0.3 | — | — | — | — | 0.5 | 1.5 | 1250 |
| 14 | 43.0 | 56.0 | 1.0 | — | — | — | — | — | 0.3 | — | — | — | — | 0.5 | 1.5 | 1250 |
| 15 | 52.0 | 47.0 | 1.0 | — | — | — | — | — | 0.3 | — | — | — | — | 0.5 | 1.5 | 1250 |
| 16 | 75.0 | 23.0 | 2.0 | — | — | — | — | — | — | — | — | — | — | — | 1.5 | 1250 |
| 17 | 75.0 | 23.0 | 2.0 | — | — | — | — | — | 0.3 | — | — | — | — | — | 1.5 | 1250 |
| 18 | 75.0 | 23.0 | 2.0 | — | — | — | — | — | — | 0.3 | — | — | — | — | 1.5 | 1250 |
| 19 | 75.0 | 23.0 | 2.0 | — | — | — | — | — | — | — | 0.3 | — | — | — | 1.5 | 1250 |
| 20 | 75.0 | 23.0 | 2.0 | — | — | — | — | — | — | — | — | 0.3 | — | — | 1.5 | 1250 |
| 21 | 75.0 | 23.0 | 2.0 | — | — | — | — | — | — | — | — | — | 0.3 | — | 1.5 | 1250 |
| 22 | 75.0 | 23.0 | 2.0 | — | — | — | — | — | — | — | — | — | — | 0.3 | 1.5 | 1250 |
| 23 | 40.0 | 59.9 | 0.1 | — | — | — | — | — | — | — | — | — | — | — | 0.5 | 1100 |
| 24 | 40.0 | 40.0 | 20.0 | — | — | — | — | — | — | — | — | — | — | — | 0.5 | 1100 |
| 25 | 80.0 | 0.1 | 19.9 | — | — | — | — | — | — | — | — | — | — | — | 0.5 | 1100 |
| 26 | 99.8 | 0.1 | 0.1 | — | — | — | — | — | — | — | — | — | — | — | 0.5 | 1100 |
| 27* | — | — | — | 80.0 | 17.5 | 5.0 | 107.5 | 2.5 | — | — | — | — | — | — | 1.5 | 1250 |
| 28* | — | — | — | 75.0 | 25.0 | 6.0 | 112.0 | 3.0 | — | — | — | — | — | — | 1.5 | 1250 |
| 29* | — | — | — | 99.8 | 0.1 | 0.2 | 100.3 | 0.1 | — | — | — | — | — | — | 1.5 | 1250 |
| 30* | 39.9 | 60.0 | 0.1 | — | — | — | — | — | — | — | — | — | — | — | 1.5 | 1250 |
| 31* | 39.9 | 40.1 | 20.0 | — | — | — | — | — | — | — | — | — | — | — | 1.5 | 1250 |
| 32* | 80.0 | 0.0 | 20.0 | — | — | — | — | — | — | — | — | — | — | — | 1.5 | 1250 |
| 33* | 99.9 | 0.0 | 0.1 | — | — | — | — | — | — | — | — | — | — | — | 1.5 | 1250 |

TABLE 2

| Sample No. | Number of phases | EPMA intensity ratio | | | Average particle size of each phase particle | | | Area ratio of each phase | | | Area Ratio | | ε s | 1 kHz tan δ | 1 MHz tan δ | R (MΩ) | Dielectric properties | | | | |
|---|---|---|---|---|---|---|---|---|---|---|---|---|---|---|---|---|---|---|---|---|---|
| | | Sr2/Sr1 | Sr1/Sr3 | Sr2/Sr3 | First phase particle size (μm) | Second phase particle size (μm) | Third phase particle size (μm) | Area ratio X of first phase | Area ratio Y of first phase | Area ratio Z of first phase | X/Y | Z/Y | | | | | Heat generating property (∠T) (°C.) | AC-Vb (kV) | DC-Vb (kV) | | TC (%) |
| 1 | 2 | 66 | — | — | 0.09 | 0.09 | — | 30% | 70% | 0% | 0.43 | — | 1271 | 0.06% | 3.1% | 1.E+07 | 8 | 6.1 | 15.0 | 5 | −24 | −39 |
| 2 | 2 | 33 | — | — | 0.1 | 0.1 | — | 30% | 70% | 0% | 0.43 | — | 1356 | 0.08% | 3.3% | 1.E+07 | 9 | 6.3 | 15.2 | 8 | −24 | −40 |
| 3 | 2 | 19 | — | — | 3 | 3 | — | 30% | 70% | 0% | 0.43 | — | 2900 | 0.19% | 4.6% | 1.E+07 | 10 | 6.8 | 14.9 | 8 | −25 | −42 |
| 4 | 2 | 16 | — | — | 10 | 10 | — | 30% | 70% | 0% | 0.43 | — | 3251 | 0.22% | 4.8% | 1.E+07 | 10 | 6.0 | 11.5 | 10 | −27 | −44 |
| 5 | 2 | 10 | — | — | 11 | 11 | — | 30% | 70% | 0% | 0.43 | — | 3907 | 0.29% | 5.0% | 1.E+07 | 10 | 4.9 | 11.2 | 6 | −27 | −45 |
| 6 | 3 | — | 0.2 | 5.0 | 0.09 | 0.09 | 0.09 | 15% | 15% | 70% | 1.00 | 4.67 | 1266 | 0.18% | 4.1% | 1.E+07 | 8 | 4.8 | 19.5 | 5 | −19 | −32 |
| 7 | 3 | — | 0.2 | 5.0 | 0.1 | 0.1 | 0.1 | 15% | 15% | 70% | 1.00 | 4.67 | 1326 | 0.17% | 4.2% | 1.E+07 | 8 | 4.9 | 18.4 | 7 | −20 | −33 |
| 8 | 3 | — | 0.3 | 3.3 | 3 | 3 | 3 | 15% | 15% | 70% | 1.00 | 4.67 | 2455 | 0.15% | 4.5% | 1.E+07 | 9 | 4.7 | 18.9 | 8 | −24 | −39 |
| 9 | 3 | — | 0.4 | 2.5 | 10 | 10 | 10 | 15% | 15% | 70% | 1.00 | 4.67 | 2999 | 0.21% | 5.3% | 1.E+07 | 9 | 4.3 | 14.4 | 9 | −24 | −40 |
| 10 | 3 | — | 0.6 | 1.4 | 11 | 11 | 11 | 15% | 15% | 70% | 1.00 | 4.67 | 3209 | 0.20% | 5.6% | 1.E+07 | 9 | 3.9 | 11.9 | 5 | −25 | −41 |
| 11 | 2 | 2 | — | — | 3 | 3 | — | 8% | 92% | 0% | 0.09 | — | 2913 | 0.36% | 8.5% | 4.E+06 | 13 | 4.5 | 11.1 | 6 | −33 | −54 |
| 12 | 3 | — | 0.6 | 1.4 | 3 | 3 | 3 | 4% | 4% | 92% | 1.00 | 23.00 | 2649 | 0.22% | 9.1% | 5.E+06 | 15 | 3.7 | 11.2 | 8 | −32 | −52 |
| 13 | 3 | — | 0.6 | 1.7 | 3 | 3 | 3 | 5% | 5% | 90% | 1.00 | 18.00 | 2598 | 0.19% | 7.5% | 9.E+06 | 13 | 4.2 | 12.9 | 7 | −29 | −48 |
| 14 | 3 | — | 0.1 | 9.1 | 3 | 3 | 3 | 45% | 45% | 10% | 1.00 | 0.22 | 1547 | 0.09% | 3.2% | 1.E+07 | 8 | 6.3 | 15.9 | 4 | −16 | −27 |
| 15 | 3 | — | 0.2 | 6.7 | 3 | 3 | 3 | 46% | 46% | 8% | 1.00 | 0.17 | 1299 | 0.08% | 3.1% | 5.E+06 | 8 | 6.2 | 15.0 | 3 | −16 | −26 |
| 16 | 3 | — | 0.3 | 2.9 | 3 | 3 | 3 | 15% | 15% | 70% | 1.00 | 4.67 | 2495 | 0.34% | 6.1% | 1.E+06 | 12 | 4.1 | 13.9 | 8 | −26 | −43 |
| 17 | 3 | — | 0.3 | 3.3 | 3 | 3 | 3 | 15% | 15% | 70% | 1.00 | 4.67 | 2401 | 0.09% | 4.3% | 4.E+06 | 10 | 5.0 | 18.0 | 5 | −22 | −36 |
| 18 | 3 | — | 0.3 | 3.6 | 3 | 3 | 3 | 15% | 15% | 70% | 1.00 | 4.67 | 2269 | 0.13% | 4.6% | 3.E+06 | 10 | 4.7 | 16.9 | 4 | −22 | −36 |
| 19 | 3 | — | 0.3 | 3.2 | 3 | 3 | 3 | 15% | 15% | 70% | 1.00 | 4.67 | 2291 | 0.15% | 4.1% | 6.E+06 | 9 | 4.6 | 16.5 | 4 | −22 | −37 |
| 20 | 3 | — | 0.3 | 3.0 | 3 | 3 | 3 | 15% | 15% | 70% | 1.00 | 4.67 | 2392 | 0.09% | 4.5% | 9.E+06 | 10 | 5.6 | 17.0 | 8 | −19 | −31 |
| 21 | 3 | — | 0.4 | 2.6 | 3 | 3 | 3 | 15% | 15% | 70% | 1.00 | 4.67 | 2341 | 0.10% | 4.9% | 8.E+06 | 10 | 4.7 | 17.3 | 6 | −21 | −34 |
| 22 | 3 | — | 0.3 | 3.3 | 3 | 3 | 3 | 15% | 15% | 70% | 1.00 | 4.67 | 2463 | 0.09% | 4.2% | 7.E+07 | 10 | 5.0 | 18.3 | 7 | −21 | −35 |
| 23 | 3 | — | 0.1 | 10.0 | 0.09 | 0.09 | 0.09 | 2% | 2% | 96% | 1.00 | 48.00 | 1324 | 0.32% | 6.2% | 9.E+06 | 12 | 3.6 | 13.1 | 16 | −27 | −44 |
| 24 | 3 | — | 0.1 | 7.7 | 0.09 | 0.09 | 0.09 | 2% | 2% | 96% | 1.00 | 48.00 | 1263 | 0.18% | 5.6% | 7.E+06 | 11 | 4.3 | 13.9 | 15 | −25 | −41 |
| 25 | 2 | 59 | — | — | 0.09 | 0.09 | — | 1% | 99% | 0% | 0.01 | — | 2017 | 0.26% | 8.6% | 7.E+06 | 14 | 5.1 | 11.5 | 18 | −34 | −56 |

TABLE 2-continued

| Sample No. | Number of phases | EPMA intensity ratio Sr2/Sr1 | EPMA intensity ratio Sr1/Sr3 | EPMA intensity ratio Sr2/Sr3 | Average particle size of each phase particle - First phase particle size (μm) | Average particle size of each phase particle - Second phase particle size (μm) | Average particle size of each phase particle - Third phase particle size (μm) | Area ratio of each phase - Area ratio X of first phase | Area ratio of each phase - Area ratio Y of first phase | Area ratio of each phase - Area ratio Z of first phase | Area Ratio X/Y | Area Ratio Z/Y | ε s | 1 kHz tan δ | 1 MHz tan δ | R (MΩ) | Heat generating property (∠T) (°C.) | AC-Vb (kV) | DC-Vb (kV) | TC (%) | TC (%) |
|---|---|---|---|---|---|---|---|---|---|---|---|---|---|---|---|---|---|---|---|---|---|
| 26 | 2 | 55 | — | — | 0.09 | 0.09 | — | 1% | 99% | 0% | 0.01 | — | 2876 | 0.42% | 9.8% | 8.E+06 | 15 | 5.0 | 11.8 | 20 | −36 −59 |
| 27* | 1 | no phase separaton | | | Particle having particle size of 3 μm and uniform Sr composition | | | — | — | 100% | — | — | 3217 | 1.48% | 13.2% | 4.E+05 | 19 | 3.2 | 9.5 | −21 | −41 −67 |
| 28* | 1 | no phase separaton | | | Particle having particle size of 3 μm and uniform Sr composition | | | — | — | 100% | — | — | 3009 | 1.36% | 14.5% | 7.E+05 | 20 | 3.3 | 9.3 | −17 | −38 −63 |
| 29* | 1 | no phase separaton | | | Particle having particle size of 3 μm and uniform Sr composition | | | — | — | 100% | — | — | 4197 | 2.50% | 22.1% | 6.E+05 | 28 | 3.0 | 7.5 | −19 | −43 −71 |
| 30* | 1 | no phase separaton | | | Particle having particle size of 3 μm and uniform Sr composition | | | — | — | 100% | — | — | 1206 | 0.41% | 11.9% | 7.E+05 | 18 | 3.6 | 9.1 | 8 | −33 −54 |
| 31* | 1 | no phase separaton | | | Particle having particle size of 3 μm and uniform Sr composition | | | — | — | 100% | — | — | 849 | 0.41% | 11.4% | 7.E+05 | 17 | 3.7 | 9.3 | 6 | −31 −51 |
| 32* | 1 | no phase separaton | | | Particle having particle size of 3 μm and uniform Sr composition | | | — | — | 100% | — | — | 1248 | 0.41% | 13.0% | 7.E+05 | 19 | 3.1 | 7.4 | −21 | −32 −53 |
| 33* | 1 | no phase separaton | | | Particle having particle size of 3 μm and uniform Sr composition | | | — | — | 100% | — | — | 3456 | 0.41% | 13.6% | 7.E+05 | 19 | 2.8 | 6.8 | −26 | −42 −69 |

In the above Tables, "*" indicates comparative example. According to Table 2, as for the dielectric composition having a phase-separation structure of two phases with different Sr concentrations as in the first embodiment of the present invention, even though lead is not substantially used, a high specific permittivity of 1250 or higher was attained, while having good temperature property of 20% to −59% at −25° C. to 125° C., a high AC breakdown voltage of 4.9 kV/mm or higher, a high DC breakdown voltage of 11.2 kV/mm or higher, a small dielectric loss of 0.42% or less at 1 kHz and 9.8% or less at 1 MHz, and also having a good temperature property of 15° C. or less of heat generation ($\Delta T$) when 90 kHz 250V/mm was applied.

Also, as for the dielectric composition having a phase-separation structure of three phases with different Sr concentrations as in the second embodiment of the present invention, even though lead is not substantially used, a high specific permittivity of 1250 or higher was attained, while having a good temperature property of 16% to −52% at −25° C. to 125° C., a high AC breakdown voltage of 3.2 kV/mm or higher, a high DC breakdown voltage of 11.2 kV/mm or higher, a small dielectric loss of 0.34% or less at 1 kHz and 9.1% or less at 1 MHz, and also having a good temperature property of 15° C. or less of heat generation ($\Delta T$) when 90 kHz 250V/mm was applied.

DESCRIPTION OF THE REFERENCE NUMERAL

1 . . . Single layer capacitor
10 . . . Dielectric composition
12a, 12b . . . Terminal
14a, 14b . . . Electrode
16 . . . Synthetic resin
20 . . . Phase having relatively low Sr characteristic X ray intensity (low Sr phase)
21 . . . Phase having relatively high Sr characteristic X ray intensity (high Sr phase)
22 . . . Phase having intermediate Sr characteristic X ray phase (intermediate Sr phase)

What is claimed is:

1. A dielectric composition including Ba, Ca, Bi, Ti, and Sr, wherein
the dielectric composition includes two phases having different Sr characteristic X ray intensities when a characteristic X ray intensity derived from Sr is measured by EPMA, and
when Sr1 represents the characteristic X ray intensity derived from Sr of a first phase measured by EPMA and Sr2 represents the characteristic X ray intensity derived from Sr of a second phase measured by EPMA,
a ratio (Sr2/Sr1) of Sr2 with respect to Sr1 satisfies 2 or larger.

2. The dielectric composition according to claim 1, wherein the first phase comprises a dielectric particle having a crystal particle size of 0.1 μm or more and 10 μm or less, and
the second phase comprises a dielectric particle having a crystal particle size of 0.1 μm or more and 10 μm or less.

3. The dielectric composition according to claim 1, wherein
when X represents an area ratio of the first phase with respect to an entire observation field of EPMA and Y represents an area ratio of the second phase with respect to an entire observation field of EPMA,
an area ratio (X/Y) of X with respect to Y is 0.1 or more.

4. The dielectric composition according to claim 3, wherein a ratio of a total area (X+Y) of the first phase and the second phase with respect to the entire observation field of EPMA is 95% or more.

5. A dielectric composition including Ba, Ca, Bi, Ti, and Sr, wherein
the dielectric composition includes three phases having different Sr characteristic X ray intensities when a characteristic X ray intensity derived from Sr is measured by EPMA, and
when Sr1 represents the characteristic X ray intensity derived from Sr of a first phase measured by EPMA, Sr2 represents the characteristic X ray intensity derived from Sr of a second phase measured by EPMA, and Sr3 represents the characteristic X ray intensity derived from Sr of a third phase measured by EPMA,
an intensity ratio (Sr1/Sr3) of Sr1 with respect to Sr3 is 0.6 or less and
an intensity ratio (Sr2/Sr3) of Sr2 with respect to Sr3 is 1.4 or more.

6. The dielectric composition according to claim 5, wherein the first phase comprises a dielectric particle having a crystal particle size of 0.1 μm or more and 10 μm or less,
the second phase comprises a dielectric particle having a crystal particle size of 0.1 μm or more and 10 μm or less, and
the third phase comprises a dielectric particle having a crystal particle size of 0.1 μm or more and 10 μm or less.

7. The dielectric composition according to claim 5, wherein
when X represents an area ratio of the first phase with respect to an entire observation field of EPMA,
Y represents an area ratio of the second phase with respect to an entire observation field of EPMA, and
Z represents an area ratio of the third phase with respect to an entire observation field of EPMA,
an area ratio (X/Y) of X with respect to Y is 0.1 or more and
an area ratio (Z/Y) of Z with respect to Y is 0.17 or more.

8. The dielectric composition according to claim 7, wherein a ratio of a total area (X+Y+Z) of the first phase, the second phase, and the third phase with respect to the entire observation field of EPMA is 95% or more.

9. An electronic component including the dielectric composition according to claim 1.

10. An electronic component including the dielectric composition according to claim 2.

11. An electronic component including the dielectric composition according to claim 3.

12. An electronic component including the dielectric composition according to claim 4.

13. An electronic component including the dielectric composition according to claim 5.

14. An electronic component including the dielectric composition according to claim 6.

15. An electronic component including the dielectric composition according to claim 7.

16. An electronic component including the dielectric composition according to claim 8.

* * * * *